United States Patent [19]

Ishii

[11] Patent Number: 5,041,891
[45] Date of Patent: Aug. 20, 1991

[54] HALL IC FORMED IN GAAS SUBSTRATE
[75] Inventor: Tetsuo Ishii, Fujisawa, Japan
[73] Assignee: Kabushiki Kaisha Toshiba, Kawasaki, Japan
[21] Appl. No.: 606,318
[22] Filed: Oct. 31, 1990
[30] Foreign Application Priority Data Nov. 7, 1989 [JP] Japan .................................. 1-288004

[51] Int. Cl.$^5$ .................. H01L 27/22; H01L 29/06; H01L 29/04; H03K 17/90
[52] U.S. Cl. ........................................ 357/27; 357/41; 357/55; 357/60; 307/309
[58] Field of Search ...................... 357/27, 41, 55, 60; 307/309

[56] References Cited

FOREIGN PATENT DOCUMENTS 58-140158 8/1983 Japan .
62-113016 5/1987 Japan .
1-31482 2/1989 Japan .

OTHER PUBLICATIONS

Keijiro Itakura et al., "Design and Fabrication of GaAs Hall IC with SCFL Schmitt Trigger", Electronics & Communications in Japan, Part 2, vol. 71, No. 12, pp. 20–26, 1988.

Primary Examiner—Mark Prenty
Attorney, Agent, or Firm—Finnegan, Henderson, Farabow, Garrett and Dunner

[57] ABSTRACT

A Hall element and an amplifier for amplifying an output generated from the Hall element are formed in a GaAs substrate. The Hall element has a current path extending at an angle of 45°±10° to a cleavage direction of a GaAs wafer from which the GaAs substrate is formed. The amplifier comprises amplifying FETs for receiving the output generated from the Hall element, each of which has a current path extending in the direction of a crystal axis $<01\bar{1}>\pm10°$. The amplifier further comprises other semiconductor elements such as FETs and resistors, each of which has a current path extending in parallel with a dicing line, that is, extending at an angle of ±45° to a cleavage direction of a GaAs wafer from which the GaAs substrate is formed.

6 Claims, 3 Drawing Sheets

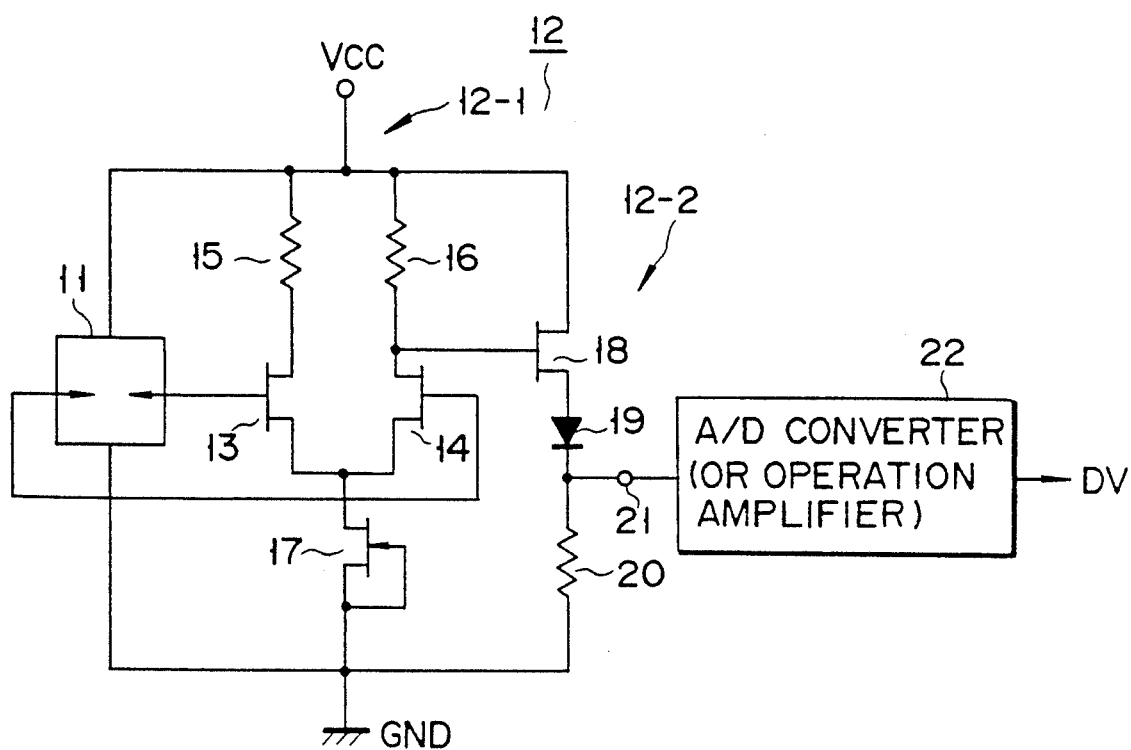
F I G. 1
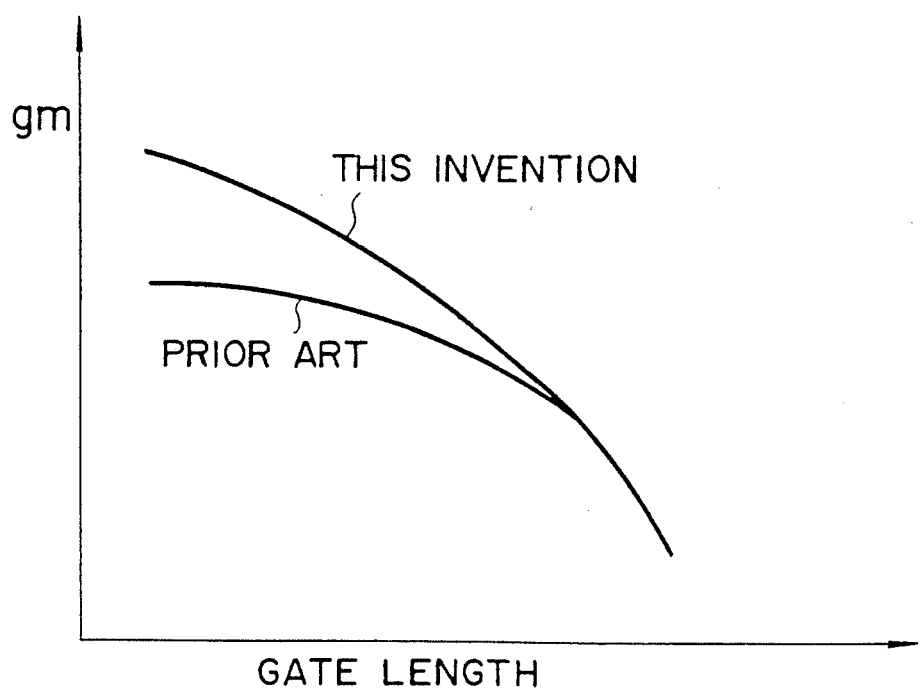
F I G. 4

HALL IC FORMED IN GAAS SUBSTRATE

BACKGROUND OF THE INVENTION

1. Field of the Invention

This invention relates to a Hall IC (integrated circuit) using a GaAs substrate.

2. Description of the Related Art

Two types of monolithic Hall ICs using a GaAs substrate are known. The first type incorporates a Hall element and an amplifier for amplifying the output of the Hall element. The second type is identical to the first type, except that it further incorporates a Schmitt circuit (or the like) for subjecting the output of such an amplifier to A/D (analog-to-digital) conversion. The second type is disclosed by, for example, Published Unexamined Japanese Patent Application No. 62-113016, published May 23, 1987.

If the GaAs substrate is diced with a blade in the forward mesa direction, chipping of the substrate and/or zigzag cutting thereof will easily occur. Here, the forward mesa direction corresponds to the direction of a crystal axis $<01\bar{1}>$. If the GaAs substrate is etched or diced in the forward mesa direction in the cleavage plane, the cross section of the crystal structure shows a trapezoid having an upside and a base longer than the upside. On the other hand, the reverse mesa direction corresponds to the direction of a crystal axis $<0\bar{1}1>$. If the substrate is etched or diced in the reverse mesa direction in the cleavage plane, the cross section of the crystal structure shows a reverse trapezoid having an upside and a base shorter than the upside. To avoid chipping or zigzag cutting, to make the required area of a pellet smaller, the pellet is usually diced at an angle of $\pm 45°$ to the cleavage direction. Further, to enhance the intensity of integration, FETs (Field Effect Transistors) and resistors have current paths extending in parallel with dicing lines formed in the substrate, that is, extending at an angle of $\pm 45°$ to the cleavage direction.

However, in the above-described conventional art, it is difficult to enhance the conductance (gm) of amplifying FETs, serving as a part of the amplifier, for receiving the output of the Hall element. This is because of the following:

The conductance (gm) is increased by shortening the gate length of a FET. However, if the FET has a current path extending in the direction of a crystal axis $<010>$ or $<00\bar{1}>$, the conductance reaches a maximum value when the gate length is about 2 μm. Thus, the gain of the amplifier and hence the output voltage thereof cannot be further increased. Also the minimum magnetic force the device can detect cannot be further lowered. More specifically, if the magnetic field intensity is 1K gauss, and the output voltage of the Hall element (sensor) is 100 mV, the gain of the amplifier is about 10, and therefore the output voltage of the amplifier is only about 1 V only. This may cause erroneous operational of an operation amplifier, if it is connected to the output terminal of the amplifier. Alternatively, if an A/D converter is connected to the output terminal of the amplifier, the minimum magnetic force the device can detect is as large as about 300 gauss. That is, the device cannot detect a magnetic field of low intensity.

SUMMARY OF THE INVENTION

It is the object of the invention to provide a Hall IC which has an amplifier section having an increased gain, and hence can output high voltage or show high sensitivity to a magnetic field.

To attain the object, the present invention comprises a GaAs substrate; a Hall element formed in the GaAs substrate; and an amplifier, formed in the GaAs substrate, for amplifying an output from the Hall element, and having amplifying FETs for receiving the output from the Hall element, and semiconductor elements connected to the amplifying FETs, the amplifying FETs each having a current path extending in the direction of a crystal axis $<01\bar{1}>+10°$, the semiconductor elements each having a current path extending at an angle of $45°\pm 10°$ to a cleavage direction of a GaAs wafer from which the GaAs substrate is formed.

In this way, the current paths of the Hall element, semiconductor elements such as resistors and FETs other than the amplifying FETs extend in parallel with dicing lines at an angle of $45°\pm 10°$ to the cleavage direction ($\pm 10°$ is a range within which the characteristics can remain unchanged even if a mask shift or some other problem occurs during the manufacturing of ICs), while only the current paths of the amplifying FETs extend in the direction of the crystal axis $<01\bar{1}>\pm 10°$ ($\pm 10°$ is provided for the same purpose as above). By virtue this structure, the elements can be aligned with high accuracy, thereby enhancing the intensity of integration of thereof, and also the adverse effect which may be made on the conductance (gm) of a FET by shortening the gate length thereof can be prevented. As a result, the output of the amplifier is increased, and in a case where the output is subjected to A/D conversion, the sensitivity to the magnetic field is increased. Moreover, if the dicing lines are formed in a pellet at an angle of $45°\pm 10°$ to the cleavage direction, the pellet can be used without waste due to chipping or zig-zag cutting with a blade.

Additional objects and advantages of the invention will be set forth in the description which follows, and in part will be obvious from the description or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit diagram showing an arrangement of a Hall IC according to an embodiment of the invention;

FIG. 4 is a graph, useful in comparing the relationship between the gate length of a conventional amplifying FET and the conductance (gm) thereof with that between the gate length of the amplifying FET of the invention and the conductance thereof.

DETAILED DESCRIPTION OF THE PREFERRED EMBODIMENTS

Figure 2:
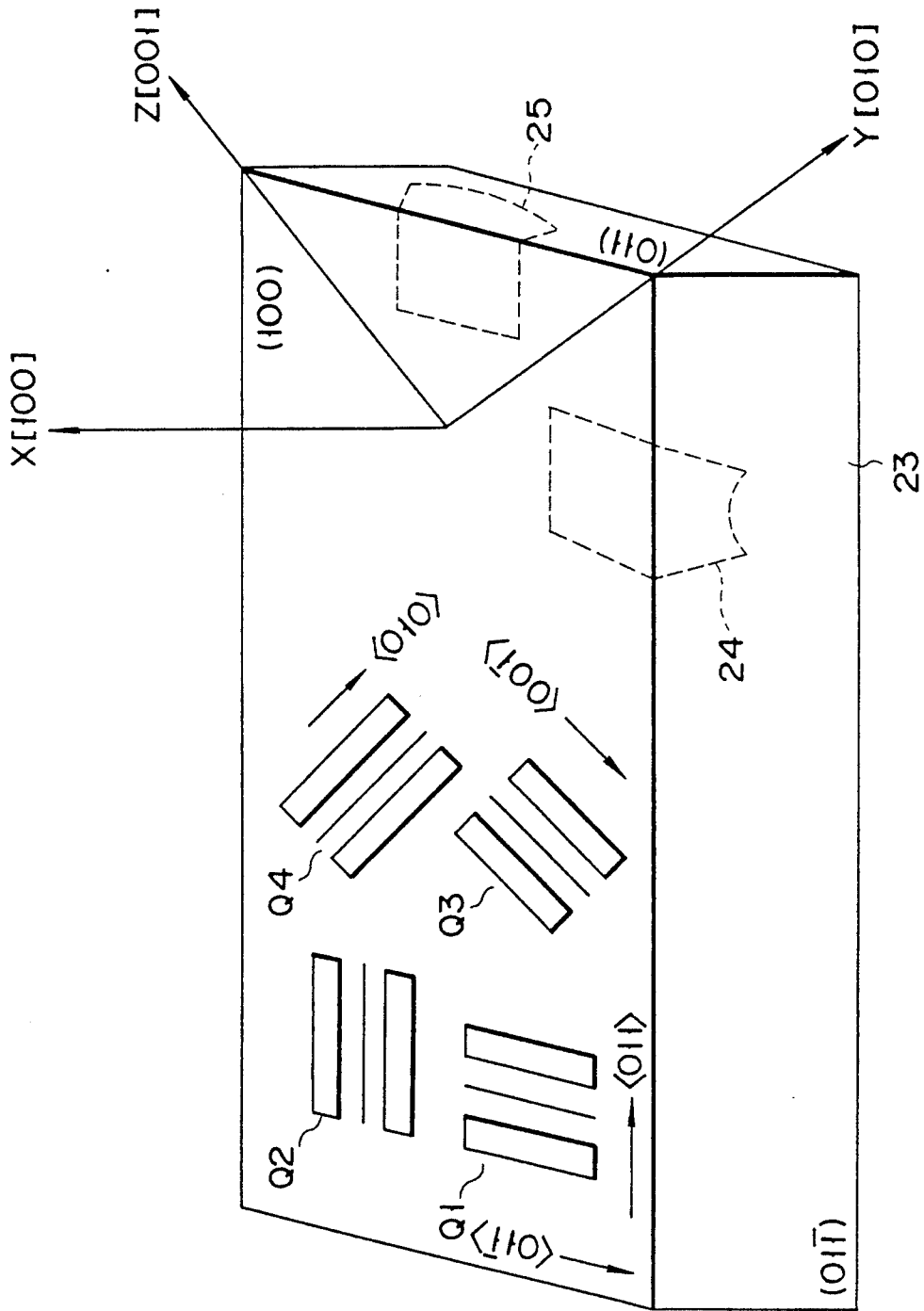
FIG. 2 is a perspective view of a GaAs substrate and FETs formed therein, useful in explaining directions of conduction of the FETs.

This invention will now be described in detail with reference to the drawings showing an embodiment thereof.

FIG. 1 shows a circuit showing an arrangement of the Hall IC according to the embodiment of the invention. A current path of a Hall element 11 is connected between a power source Vcc and a ground GND, and supplies an output signal to an amplifier 12. The amplifier 12 has an amplifying part 12-1 comprising amplifying FETs 13 and 14 for receiving the signals output from the Hall element 11, resistors 15 and 16 serving as loads, and a FET 17 serving as a constant current source. The FETs 13 and 14 have respective gates connected to the Hall element 11, respective drains, and a common source. The resistors 15 and 16 are connected between the drains of the FETs and the power source Vcc, respectively. The FET 17 has a current path connected between the common source of the amplifying FETs 13 and 14 and the ground GND, and a gate connected to the ground GND. The amplifier 12 also has an output part 12-2 to be supplied with the signal output from the amplifying part 12-1, and comprising a FET 18, a diode 19, and a resistor 20. The current path of the FET 18, diode 19, and resistor 20 are connected in series between the power source Vcc and ground GND. The gate of the FET 18 is connected to the junction between the drain of the FET 14 and one end of the resistor 16. An output terminal 21 has an end connected between the cathode of the diode 19 and resistor 20, and the other end connected to an input terminal of an A/D converter (or operation amplifier) 22 for subjecting the output signal from the amplifier 12 to A/D conversion, or amplifying the same, and outputting a signal DV indicative of the former.

FIG. 2 is a view useful in explaining an arrangement, that is, directions of conduction, of FETs formed in a GaAs substrate 23. FETs Q1-Q4, which have respective current paths extending in different directions, are formed in a main surface having Miller indices (100) of the substrate 23. Specifically, the current paths of the FETs Q1-Q4 extend in the directions of a crystal axis $<011>$, a crystal axis $<01\bar{1}>$, a crystal axis $<010>$, and a crystal axis $<00\bar{1}>$, respectively. The broken lines 24 and 25 indicate the forward mesa direction, and the reverse mesa direction, respectively.

In the circuit shown FIG. 1, only the current paths of the amplifying FETs 13 and 14 extend in the same direction as that of the FET Q2, that is, in the direction of the crystal axis $<01\bar{1}>$, while the current paths of the other semiconductor elements, such as the Hall element 11, FETs 17 and 18, resistors 15, 16, and 20, diode 19, and those FETs, resistors, and diodes which form the A/D converter (or operation amplifier) 22 extend in the same direction as that of the FET Q3 or Q4, that is, in the direction of the crystal axis $<010>$ or $<00\bar{1}>$.

Figure 3:
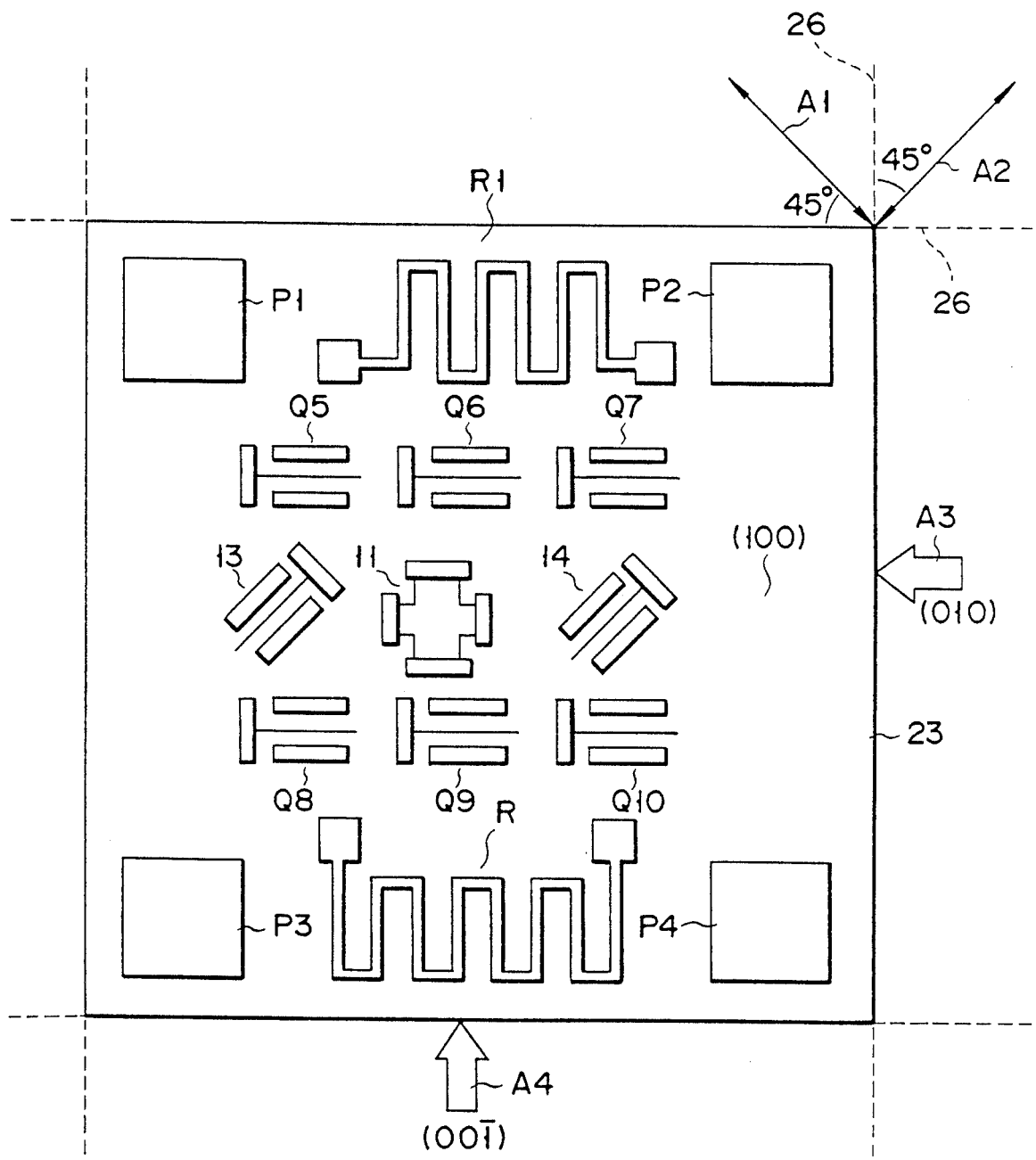
FIG. 3 is a plan view of a GaAs substrate and FETs formed therein, useful in explaining an arrangement of an essential part of the FETs which form the circuit shown in FIG. 1.

The arrangement of the above-described elements will now be explained in detail with reference to FIG. 3. FIG. 3 is a plan view of a GaAs substrate and FETs formed therein, useful in explaining an arrangement of an essential part of the FETs which form the circuit shown in FIG. 1. For easy understanding of the directions of the current paths of the elements, the elements shown in FIG. 3 do not correspond to those shown in FIG. 1 in an exact manner, but the wiring layers are omitted from FIG. 3. A wafer, having a main surface (100) and made of GaAs, is diced with a blade along dicing lines 26, thereby forming GaAs substrates (chips) 23. Dicing lines 26, along which the wafer is diced, are formed on the wafer at angles of $\pm 45°$, to the cleavage directions indicated by arrows A1 and A2, in order to eliminate waste due to chipping or zigzag cutting done with the dicing blade. That side of the substrate 23 indicated by arrow A3 is a Miller indices (010), and that side of the substrate 23 indicated by arrow A4 is a Miller indices (00$\bar{1}$). The Hall element 11, amplifier 12, A/D converter (or operation amplifier) 22, which are shown in FIG. 1, are formed monolithically in the main surface (100) of the GaAs substrate 23, which can have well regions and the like formed therein. The current paths of the FETs 17 and 18 of the amplifier 12, resistors 15, 16, and 20, diode 19, and those FETs, resistors, and diodes which form the A/D converter (or operation amplifier) 22 extend parallel with the dicing lines 26, i.e., at an angle of $\pm 45°$ to the cleavage directions, thus enhancing the intensity of integration of elements. In FIG. 3, Q5-Q10 represent a plan pattern which corresponds to the FETs Q3 and Q4 shown in FIG. 2 of the FETs 17 and 18, and the FET constituting the A/D converter 22, while R1 and R2 represent a plan pattern of the resistors 15, 16, and 20 and the resistors constituting the A/D converter 22. Only the direction of conduction of the amplifying FETs 13 and 14, which corresponds to that of the FET Q2 shown in FIG. 2, is $<01\bar{1}> \pm 10°$ where $\pm 10°$ is a range within which the characteristics can remain unchanged even if a mask shift or some other problem occurs during the manufacturing of ICs, and preferably the current paths extend in the direction of the crystal axis $<01\bar{1}>$. P1-P4 represent bonding pads for inputting and outputting data. The bonding pads P1-P4, resistors R1 and R2, FETs Q5-Q10, Hall element 11, and amplifying FETs 13 and 14 are selectively connected to one another by wiring layers (not shown), thereby forming the circuit shown in FIG. 1.

As is shown in FIG. 4, the conductance (gm) of the conventional amplifying FET, which has a current path extending in the direction of the crystal axis $<010>$ or $<00\bar{1}>$, reaches its maximum at a gate length of about 2 μm, whereas the conductance (gm) of a FET, which is used as the amplifying FETs 13 and 14, in the present invention, increases in inverse proportion to the gate length until the gate length decreases to 1 μm, since the FET has a current path extending in the direction of the crystal axis $<01\bar{1}>$. Thus, the conventional amplifier can provide a gain of about only 10. On the other hand, the amplifier 12 according to the present invention can provide a maximum gain of about 20, if the gate length of the amplifying FETs 13 and 14 is set to 1 μm. As a result, the output of the Hall element 11, obtained after amplification, can be increased to 2V which is twice of that of the conventional one, and if the A/D converter 22 is connected to the output terminal 21 of the amplifier 12, as is shown in FIG. 1, the minimum magnetic force the device of the present invention can detect, can be lowered to 100 gauss, which is a third of that which the conventional device can detect. Further, in the present invention, the dicing lines 26 are formed at angles of $\pm 45°$ to the cleavage direction, and the semiconductor elements other than the amplifying FETs 13 and 14 are arranged in parallel with the dicing lines 26, i.e., in the directions of the crystal axes $<010>$ and $<00\bar{1}>$, which eliminates waste due to chipping or zigzag cutting, and also prevents a reduction in the intensity of integration due to a reduction in the alignment of the elements.

Although the present invention is explained referring to the Hall IC formed in the GaAs substrate, it can be also applied to GaAs ICs which operate at high speed, or are used for optical communication. In these cases, the FETs incorporated in a circuit in which a static operation is performed, such as a biasing circuit, have current paths extending in the direction of the crystal axis $<010>$ or $<00\bar{1}>$, while the FETs incorporated in a circuit in which a dynamic operation is performed, such as an amplifying circuit of an input section, or an output driving section, have current paths extending in the direction of the crystal axis $<01\bar{1}>$.

As is described above, only the current paths of the amplifying FETs of the amplifier, incorporated in the monolithic Hall IC formed in the GaAs substrate, extend in the direction of the crystal axis $<01\bar{1}>\pm10°$, which increases the gain of the amplifier and the output of the Hall element, obtained after amplification. As a result, erroneous operation can be prevented which may be caused if an operation amplifier is connected to an output terminal of the amplifier, while the minimum magnetic force which can be detected is lowered, i.e., a magnetic field of low intensity can be detected, if an A/D converter is connected to the output terminal of the amplifier. In addition to the above, the dicing lines and the current paths of semiconductor elements, such as FETs other than the amplifying FETs of the amplifier, extend in the direction of the crystal axis $<010>$ or $<00\bar{1}>$, which enables the pellet to be used without waste due to chipping, and also prevents the lowering of the alignment of the elements and hence the intensity of integration thereof.

What is claimed is:

1. A Hall IC comprising:
   a GaAs substrate;
   a Hall element formed in the GaAs substrate; and
   an amplifier formed in the GaAs substrate, for amplifying an output from the Hall element, the amplifier having amplifying FETs for receiving the output from the Hall element, and semiconductor elements connected to the amplifying FETs,
   the amplifying FETs each having a current path extending in the direction of a crystal axis $<011>\pm10$, the semiconductor elements each having a current path extending at an angle of $45°\pm10°$ to a cleavage direction of a GaAs wafer from which said GaAs substrate is formed.

2. The Hall IC according to claim 1, wherein the GaAs substrate is diced with a blade at an angle of $45°\pm10°$ to a cleavage direction of a GaAs wafer from which said GaAs substrate is formed.

3. The Hall IC according to claim 2, wherein the GaAs substrate is diced with a blade in the directions of axes $<00\bar{1}>$ and $<010>$.

4. The Hall IC according to claim 1, wherein the Hall element has a current path extending at an angle of $45°\pm10°$ to a cleavage direction of a GaAs wafer from which said GaAs substrate is formed.

5. The Hall IC according to claim 1, further comprising an A/D converter, formed in the GaAs substrate, for subjecting an output, generated from the amplifier, to analog-to-digital conversion.

6. The Hall IC according to claim 1, further comprising an operation amplifier, formed in the GaAs substrate, for amplifying an output generated from the amplifier.

* * * * *

UNITED STATES PATENT AND TRADEMARK OFFICE
CERTIFICATE OF CORRECTION

PATENT NO. : 5,041,891
DATED : August 20, 1991
INVENTOR(S) : Tetsuo Ishii

It is certified that error appears in the above-indentified patent and that said Letters Patent is hereby corrected as shown below:

<u>ON THE TITLE PAGE:</u>

In the Title and in col. 1, change "GAAS" to --GaAs--.

Claim 1, column 6, line 12, change "10" to --10--.

Signed and Sealed this

Thirty-first Day of August, 1993

Attest:

BRUCE LEHMAN

Attesting Officer     Commissioner of Patents and Trademarks